(12) United States Patent
Fiedziuszko et al.

(10) Patent No.: US 9,019,039 B1
(45) Date of Patent: Apr. 28, 2015

(54) FREQUENCY AND BANDWIDTH TUNABLE MICROWAVE FILTER

(71) Applicant: Space Systems/Loral, Inc., Palo Alto, CA (US)

(72) Inventors: Slawomir J. Fiedziuszko, Palo Alto, CA (US); Stephen C. Holme, San Ramon, CA (US); Stephen D. Berry, San Ramon, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 337 days.

(21) Appl. No.: 13/644,632

(22) Filed: Oct. 4, 2012

Related U.S. Application Data (60) Provisional application No. 61/607,819, filed on Mar. 7, 2012.

(51) Int. Cl.
*H01P 5/12* (2006.01)
*H01P 1/20* (2006.01)
*H03H 7/46* (2006.01)
*H01P 1/215* (2006.01)

(52) U.S. Cl.
CPC .................................... *H01P 1/215* (2013.01)

(58) Field of Classification Search
USPC .......................... 333/219, 202, 132, 126, 129
See application file for complete search history.

(56) References Cited

U.S. PATENT DOCUMENTS

| | | | |
|---|---|---|---|
| 3,400,343 A * | 9/1968 | Carter | 333/205 |
| 4,100,504 A * | 7/1978 | McGann | 331/39 |
| 2003/0027534 A1 | 2/2003 | Swazey | |
| 2005/0237389 A1 | 10/2005 | Pugel et al. | |
| 2009/0072927 A1 | 3/2009 | Rhodes et al. | |
| 2014/0253261 A2* | 9/2014 | Korber | 333/202 |

FOREIGN PATENT DOCUMENTS

WO   WO 2010/139562   12/2010

OTHER PUBLICATIONS

El-Tanani, "High Linearity 1.5-2.5 GHz RF-MEMS and Varactor Diodes Based Tunable Filters for Wireless Applications", University of California, San Diego, Jan. 1, 2009.

* cited by examiner

*Primary Examiner* — Robert Pascal
*Assistant Examiner* — Kimberly Glenn
(74) *Attorney, Agent, or Firm* — Weaver Austin Villeneuve & Sampson LLP (57) ABSTRACT

An RF bandpass filter includes a cascaded series of a first subfilter and a second subfilter. Each subfilter includes a respective inverter, voltage-controlled capacitor and inductor. A first selected one of the first subfilter and the second subfilter is a pseudo low pass filter and a second selected one of the first subfilter and the second subfilter is a pseudo high pass filter. The RF bandpass filter is configured to separately control a bandwidth and center frequency of output RF energy. The bandwidth may be controlled to be substantially fixed over a significant substantial range. The center frequency and bandwidth are controlled by adjusting a voltage input to one or more of the voltage-controlled capacitors.

18 Claims, 7 Drawing Sheets

FREQUENCY AND BANDWIDTH TUNABLE
MICROWAVE FILTER

CROSS-REFERENCE TO RELATED APPLICATION

The present patent application claims the priority benefit of commonly owned U.S. provisional patent application 61/607,819, filed Mar. 7, 2012, entitled "Frequency and Bandwidth Tunable Microwave Filter", which is hereby incorporated by reference in its entirety into the present patent application.

TECHNICAL FIELD

This invention relates generally to a microwave filter, and particularly to a voltage tunable RF bandpass filter having separately controlled center frequency and bandwidth.

BACKGROUND

The assignee of the present invention manufactures and deploys spacecraft for, inter alia, communications and broadcast services from geosynchronous orbit. A substantial number of radio frequency (RF) filters are required in such spacecraft. For example, a satellite input multiplexer may utilize a number of such filters, each filter having the functionality of separating and isolating a specific respective signal or bandwidth frequency from a broadband uplink signal received by a spacecraft antenna.

Figure 1:
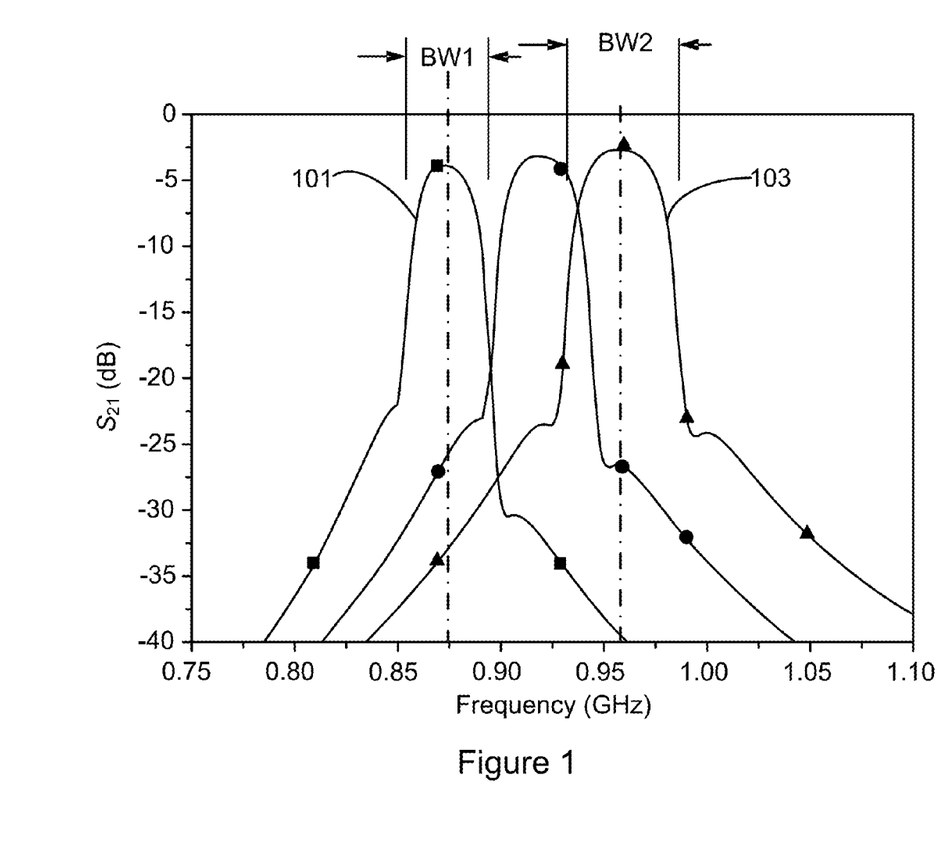
FIG. 1 shows an example of filter performance according to the prior art.

In the absence of the present teachings, the "tuneability" of such filters is limited. More particularly, when the center frequency of a bandpass filter is shifted, the bandwidth also changes. For example, referring to FIG. 1, it may be observed that a filter tuned to a center frequency of approximately 875 MHz exhibits bandpass characteristics 101, and has a bandwidth BW1 approximately equal to 40 MHz. When the same filter is tuned to a center frequency of approximately 960 MHz it exhibits bandpass characteristics 102, and has a bandwidth BW2 approximately equal to 55 MHz.

Such a substantial shift in bandwidth is unacceptable for, at least, satellite communications payloads, where constant, highly controlled bandwidth and spectral passband characteristics are required. The present invention is particularly useful for applications which require very precise bandwidth control, as for example in the case of input multiplexer channel filters employed in satellite communications payloads. Such bandwidth control has been mainly accomplished in the past by the use of fixed (non-tunable) filters.

Alternatively, when tuning filter resonant circuits by conventional means, it is possible to control bandwidth by tuning filter coupling elements as well the filter resonant circuits. Such an approach suffers from the disadvantage of introducing additional microwave components with the attendant undesirable extra volume, extra weight, cost and complexity.

A tuning filter topology utilizing cascaded, fixed, low pass and high pass filters tunable by a synthesizer and an upconverter/downconverter system has been used, for example, on the HYLAS satellite to tightly control composite filter bandwidth during the frequency adjustments. The disadvantage of this approach is that fixed low pass and high pass filters, due to their inherent very wide bandwidth, require many resonator elements to achieve necessary rejection characteristics with an attendant undesirable extra volume, extra mass and extra cost.

Thus, there remains an unmet need for an improved tunable filter topology which provides frequency and bandwidth tuning of the filter.

SUMMARY OF INVENTION

The present inventors have appreciated that an RF filter exhibiting a substantially fixed bandwidth over a significant tunable range of center frequencies may be achieved by configuring the RF filter as a cascaded series of a pseudo high pass subfilter and a pseudo low pass subfilter, each subfilter including at least one voltage-controlled capacitor. Tuning of the filter may be accomplished by adjusting a voltage input to one or more of the voltage-controlled capacitors.

In an embodiment, an RF bandpass filter includes a cascaded series of a first subfilter and a second subfilter. The first subfilter may include a first input port, a first output port, a first inverter, a first voltage-controlled capacitor and a first inductor. A proximal terminal of the first inverter may be coupled with the first input port, the first voltage-controlled capacitor and the first inductor being connected in parallel between a distal terminal of the first inverter and ground. The second subfilter may include a second input port, a second output port, a second inverter, a second voltage-controlled capacitor and a second inductor. A proximal terminal of the second inverter being coupled with the second input port, the second voltage-controlled capacitor and the second inductor being connected in parallel between a distal terminal of the second inverter and the second output port, an input terminal of the second inverter being coupled with the second input port. A first selected one of the first subfilter and the second subfilter may be a pseudo low pass filter and a second selected one of the first subfilter and the second subfilter may be a pseudo high pass filter. The RF bandpass filter may be configured to output RF energy and to separately control a bandwidth and a center frequency of the RF energy, the center frequency being tunable by adjusting a voltage input to one or both of the first voltage-controlled capacitor and the second voltage-controlled capacitor.

In an embodiment, each of the first inductor and the second inductor may have a respective self resonant frequency and one or both of the first inductor and the second inductor may operate at a frequency substantially below the respective self resonant frequency.

In another embodiment, the filter may be configured to control the bandwidth at a substantially fixed bandwidth W over a center frequency tuning range.

In an embodiment the center frequency may be tuned, and the bandwidth W may be controlled, by adjusting a respective voltage input of each of the first voltage-controlled capacitor and the second voltage-controlled capacitor. The center frequency tuning range may be from 85% to 115% of a nominal center frequency. The nominal center frequency may be greater than 500 MHz.

In a further embodiment, the first selected one of the first subfilter and the second subfilter may include a capacitive inverter.

In a yet further embodiment, the second selected one of the first subfilter and the second subfilter may include an inverter including an inductor.

In another embodiment, one or both of the first voltage-controlled capacitor and the second voltage-controlled capacitor is selected from the group consisting of: a varactor, a ferroelectric material, or a microelectromechanical system (MEMS) capacitor.

In an embodiment, a multiplexer includes at least two radio frequency (RF) bandpass filters. The multiplexer may be configured to channelize an input RF band of electromagnetic energy into a set of output channels by way of the channel filters, each output channel configured to output RF energy at a respective wavelength $\lambda_i$. At least one of the RF filters includes a cascaded series of a first subfilter and a second subfilter, the first subfilter including a first input port, a first output port, a first inverter, a first voltage-controlled capacitor and a first inductor. A proximal terminal of the first inverter is coupled with the first input port; the first voltage-controlled capacitor and the first inductor is connected in parallel between a distal terminal of the first inverter and ground. The second subfilter includes a second input port, a second output port, a second inverter, a second voltage-controlled capacitor and a second inductor. A proximal terminal of the second inverter is coupled with the second input port, the second voltage-controlled capacitor and the second inductor is connected in parallel between a distal terminal of the second inverter and the second output port. An input terminal of the second inverter is coupled with the second input port. A first selected one of the first subfilter and the second subfilter includes a pseudo low pass filter and a second selected one of the first subfilter and the second subfilter includes a pseudo high pass filter. The RF bandpass filter may configured to output RF energy and to separately control a bandwidth and a center frequency of the RF energy, the center frequency being tunable by adjusting a voltage input to one or both of the first voltage-controlled capacitor and the second voltage-controlled capacitor

BRIEF DESCRIPTION OF THE DRAWINGS

The included drawings are for illustrative purposes and serve only to provide examples of possible structures for the disclosed inventive filters and multiplexers. These drawings in no way limit any changes in form and detail that may be made by one skilled in the art without departing from the spirit and scope of the disclosed embodiments.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the disclosed subject matter, as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first subfilter could be termed a second subfilter, and similarly, a second subfilter may be termed a first subfilter without departing from the teachings of the present invention. As used herein, the term "and/or" includes any and all combinations of one or more of the associated listed items. The symbol "/" is also used as a shorthand notation for "and/or".

The terms "spacecraft", "satellite" may be used interchangeably herein, and generally refer to any orbiting satellite or spacecraft system.

Presently disclosed is an RF bandpass filter configured to exhibit substantially constant bandwidth over a range of tuneably selectable center frequencies. The RF filter may be configured as a cascaded series of a pseudo high pass subfilter and a pseudo low pass subfilter with which a center frequency and bandwidth of RF energy output by the filter may be separately controlled. In an embodiment, each subfilter includes at least one voltage-controlled capacitor, and tuning of the filter is accomplished by adjusting a voltage input to one or more of the voltage-controlled capacitors.

Figure 2A:
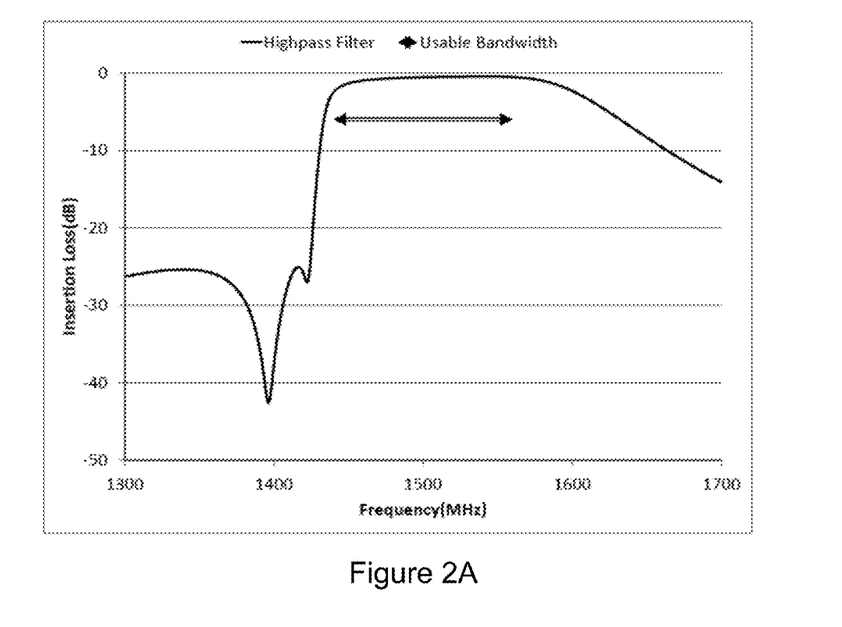
FIGS. 2A, 2B, and 2C illustrate, respectively, output characteristics of a pseudo high pass subfilter, a pseudo low pass subfilter and a composite filter including a cascaded pseudo high pass subfilter and a pseudo low pass subfilter.
Figure 2B:
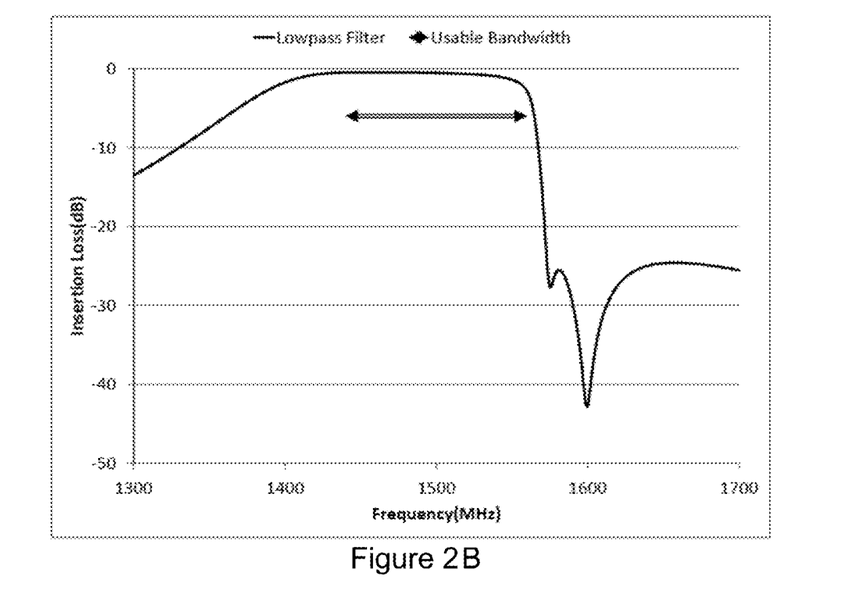
Figure 2C:
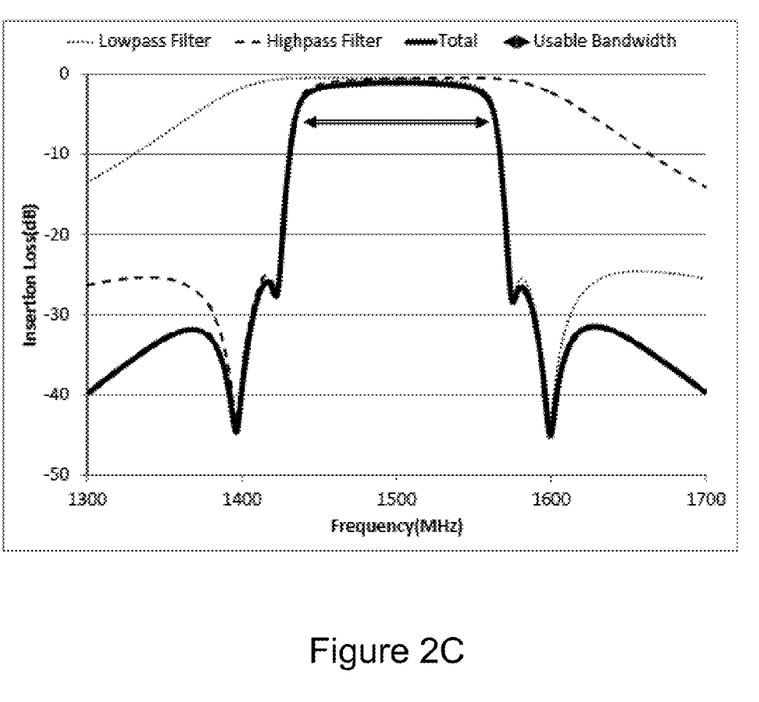

Advantageously, each subfilter provides a highly asymmetric passband, and may be independently controlled. For example, referring now to FIGS. 2A and 2B, output characteristics of, respectively, a pseudo high pass subfilter and a pseudo low pass subfilter are illustrated. Referring now to FIG. 3C, output characteristics of a composite filter including a cascaded pseudo high pass subfilter and a pseudo low pass subfilter.

Advantageously, required rejection characteristics of the composite filter over a substantial range of center frequencies may be achieved even with the use of relatively low complexity (3 or 4 pole) subfilters. For example, a tuning range of +/−15% with respect to a nominal center frequency is within the contemplation of the present inventors. In an embodiment, extracted pole design of the subfilters allows for independently controlled filter transmission zeroes for optimum spectral characteristics (rejection) of the composite filter.

Figure 3:
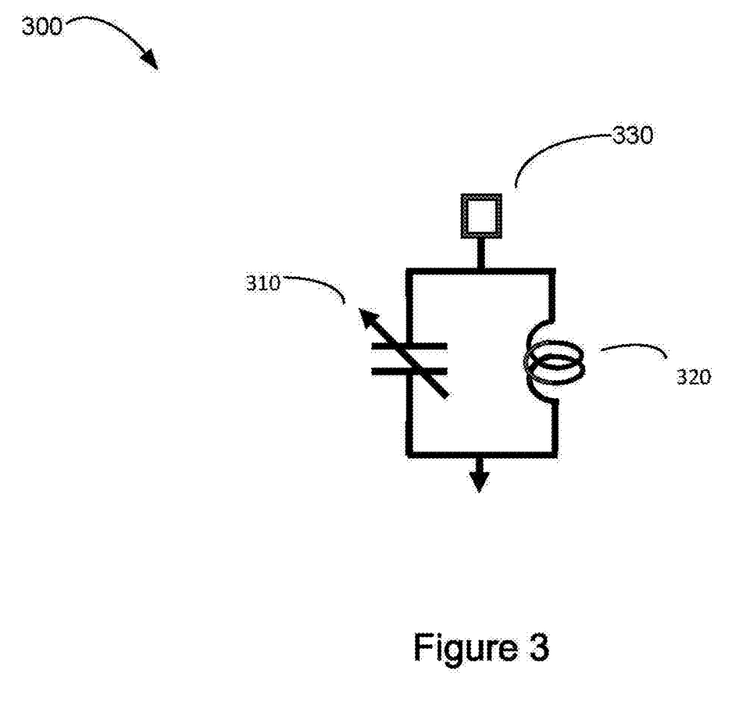
FIG. 3 shows an example of a circuit diagram of a resonant circuit of a voltage tunable filter, in accordance with an embodiment.

FIG. 3 shows an example of a circuit diagram of a basic resonant circuit 300 of a voltage tunable filter according to the present teachings. In the illustrated embodiment, resonant circuit 300 includes voltage-controlled capacitor 310, inductor 320, and inverter 330. In the illustrated implementation, voltage-controlled capacitor 310 may function as a tunable capacitor. Advantageously, inductor 320 may operate at a frequency substantially lower than its self-resonant frequency. In an embodiment, inductor 320 may be a high Q adjustable inductor. Effective capacitance of voltage-controlled capacitor 310 may be adjusted by adjusting a voltage input to voltage-controlled capacitors 310. Voltage controlled capacitor 310 may, for example, be or include a varactor, a ferroelectric material such as, for example, barium strontium titanate (BST), or a microelectromechanical system (MEMS) capacitor.

Resonant circuit 300 may be incorporated as part of a pseudo low pass subfilter or a pseudo high pass filter. In applications where resonant circuit 300 is incorporated as part of a pseudo low pass filter, inverter 330 may include an inductive inverter. In applications where resonant circuit 300 is incorporated as part of a pseudo high pass subfilter, inverter 330 may include a capacitive inverter.

Figure 4:
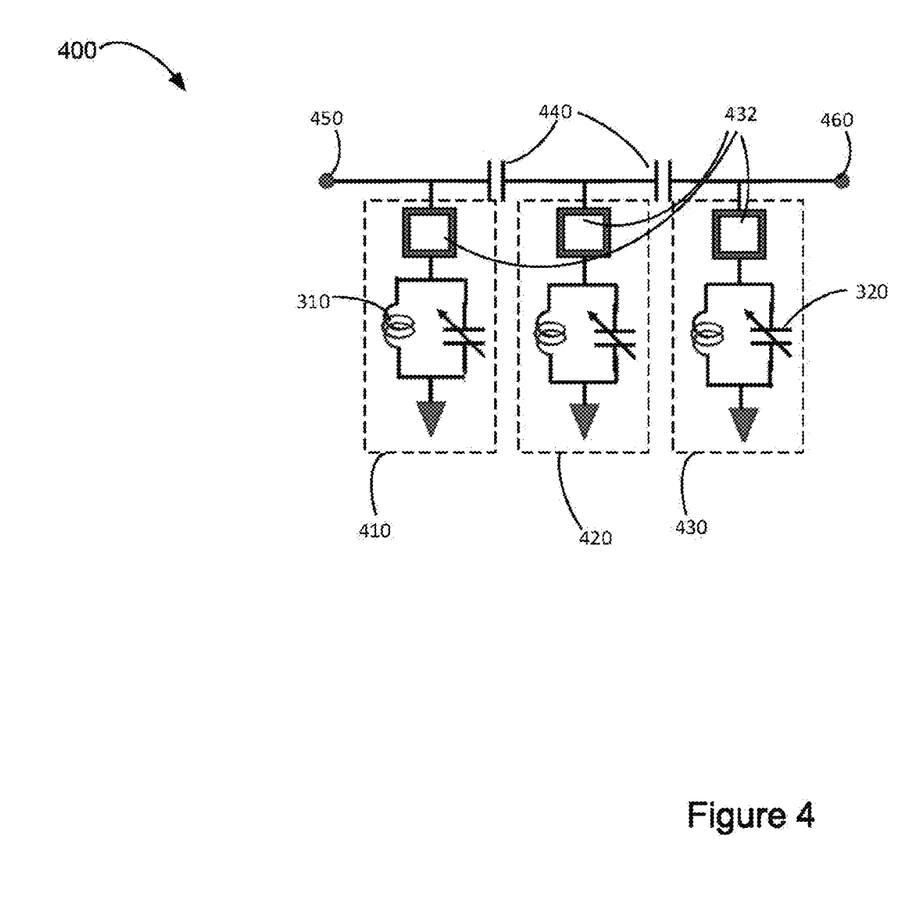
FIG. 4 shows an example of a three pole pseudo low pass filter, in accordance with an embodiment.

Referring now to FIG. 4, an example of a three pole pseudo low pass filter 400 is illustrated. In the illustrated embodiment, resonant circuits 410, 420, and 430 are connected between filter input 450 and filter output 460, together with coupling capacitors 440. Inverters 432 may include an inductive inverter. Although a three pole pseudo low pass filter is illustrated in FIG. 4, filters with a greater or lesser number of poles is within the contemplation of the present inventors.

Figure 5:
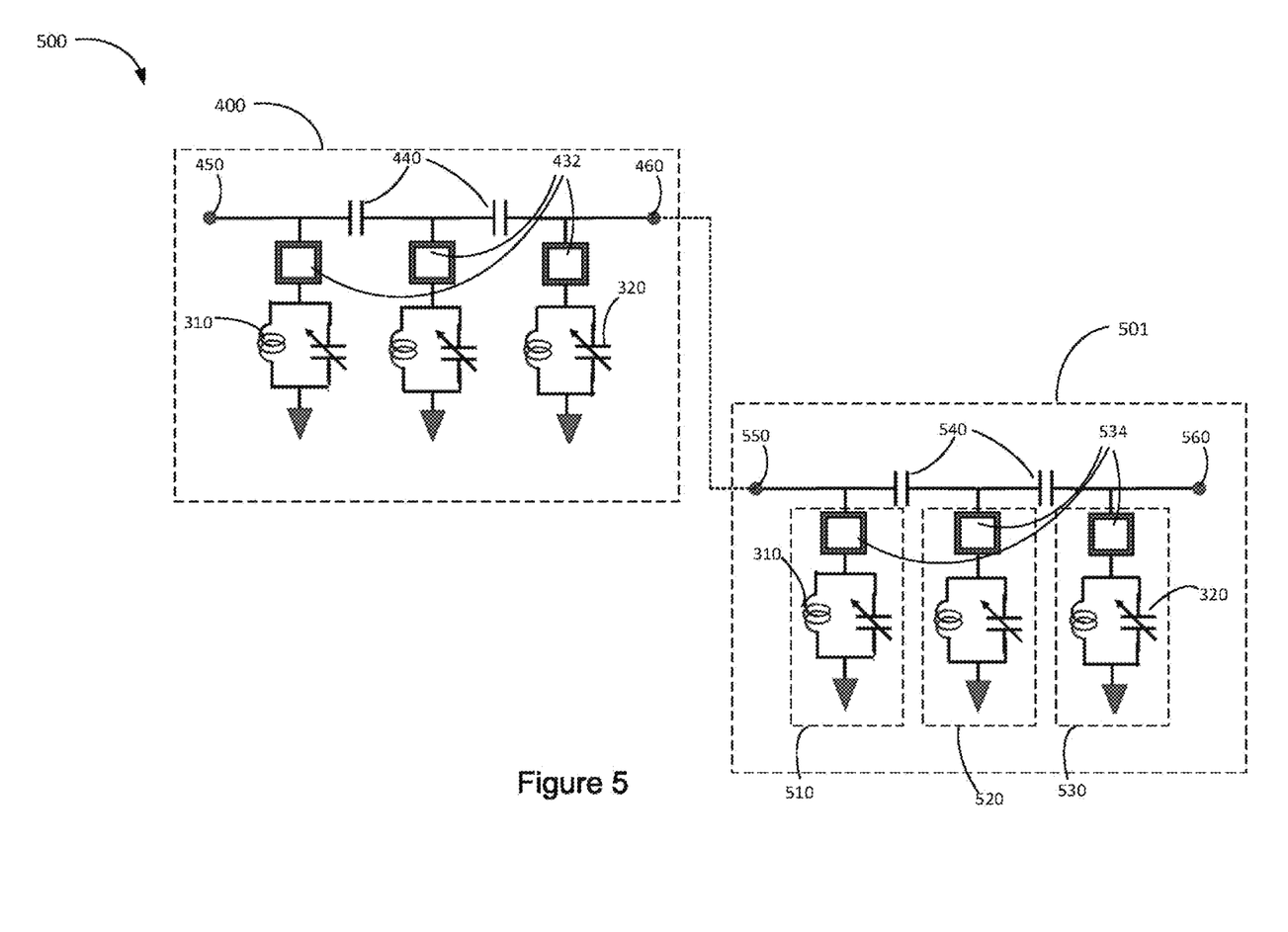
FIG. 5 shows an example of a composite filter including a pseudo low pass filter series connected with pseudo high pass filter.

FIG. 5 shows an example of a composite filter 500 including a cascaded series of pseudo low pass filter 400 and pseudo high pass filter 501. Filter output 460 of pseudo low pass filter 400 may be, as illustrated, electrically coupled, directly or indirectly with filter input 550 of pseudo high pass filter 501. Similarly to pseudo low pass filter 400, in the illustrated embodiment, resonant circuits 510, 520, and 530 are connected between filter input 550 and filter output 560, together with coupling capacitors 540. Inverters 534 may include a capacitive inverter. It will be appreciated that composite filter 500 may be configured as an RF bandpass filter operable to output a specific respective signal or frequency bandwidth 'W' from a broadband input signal. Moreover, a center frequency wavelength 'λ' of bandwidth 'W' may be tuned over a significant range by appropriately adjusting voltage inputs to one or more of voltage-controlled capacitors 320. Finally, because a respective cutoff frequency of pseudo low pass filter 400 and pseudo high pass filter 501, can be separately selected by appropriate adjustment of voltage inputs to one or more of voltage-controlled capacitors 320, a substantially fixed bandwidth 'W' may be maintained.

In an embodiment, center frequency wavelength 'λ', may be tuned over a tuning range of 85% to 115% of a nominal center frequency, while maintaining a substantially fixed bandwidth 'W'. The nominal center frequency, in an embodiment, exceeds 500 MHz.

Figure 6A:
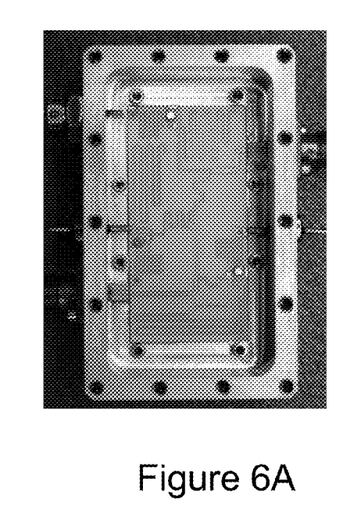
FIGS. 6A-6C illustrates fabricated subfilters, in accordance with various embodiments.
Figure 6B:
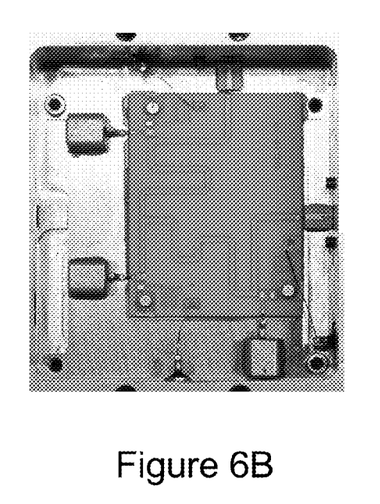
Figure 6C:
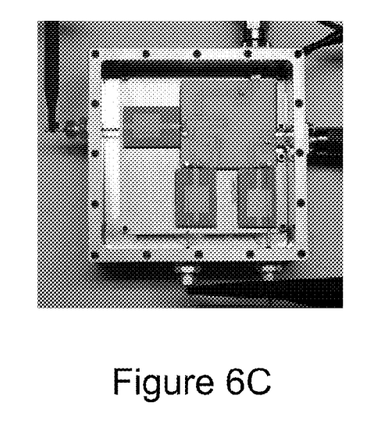

Microwave/RF resonator implementations in accordance with the present disclosure, may include one or more of a half wavelength microstrip open resonator, a coaxial ceramic resonator, and a step impedance microstrip resonator having a thick, high dielectric constant substrate. For example, referring now to FIGS. 6A-6C three types of subfilters, fabricated in accordance with the present disclosure, are illustrated. FIG. 6A illustrates an example embodiment of a subfilter with half wavelength microstrip open resonator. FIG. 6B illustrates an example embodiment of a subfilter with coaxial ceramic resonator. FIG. 6C illustrates an example embodiment of a subfilter with a stepped impedance microstrip.

Thus, a frequency and bandwidth tunable microwave filter has been disclosed. The foregoing merely illustrates principles of the invention. It will be appreciated that those skilled in the art will be able to devise numerous systems and methods which, although not explicitly shown or described herein, embody said principles of the invention and are thus within the spirit and scope of the invention as defined by the following claims.

What is claimed is:

1. A radio frequency (RF) bandpass filter, the filter comprising:
a cascaded series of a first subfilter and a second subfilter, the first subfilter comprising a first input port, a first output port, a first inverter, a first voltage-controlled capacitor and a first inductor, a proximal terminal of the first inverter being coupled with the first input port, the first voltage-controlled capacitor and the first inductor being connected in parallel between a distal terminal of the first inverter and ground; the second subfilter comprising a second input port, a second output port, a second inverter, a second voltage-controlled capacitor and a second inductor, a proximal terminal of the second inverter being coupled with the second input port, the second voltage-controlled capacitor and the second inductor being connected in parallel between a distal terminal of the second inverter and the second output port, an input terminal of the second inverter being coupled with the second input port; wherein:
a first selected one of the first subfilter and the second subfilter comprises a pseudo low pass filter and a second selected one of the first subfilter and the second subfilter comprises a pseudo high pass filter; and
the RF bandpass filter is configured to output RF energy and to separately control a bandwidth and a center frequency of the RF energy, the center frequency being tunable by adjusting a voltage input to one or both of the first voltage-controlled capacitor and the second voltage-controlled capacitor.

2. The filter of claim 1, wherein each of the first inductor and the second inductor have a respective self resonant frequency and one or both of the first inductor and the second inductor operate at a frequency substantially below the respective self resonant frequency.

3. The filter of claim 1, wherein the filter is configured to control the bandwidth at a substantially fixed bandwidth W over a center frequency tuning range.

4. The filter of claim 3, wherein the center frequency is tuned and the substantially fixed bandwidth W is controlled, by adjusting a respective voltage input of each of the first voltage-controlled capacitor and the second voltage-controlled capacitor.

5. The filter of claim 4, wherein the center frequency tuning range is from 85% to 115% of a nominal center frequency.

6. The filter of claim 5, wherein the nominal center frequency is greater than 500 MHz.

7. The filter of claim 1, wherein at least a first selected one of the first inverter and the second inverter includes a capacitive inverter.

8. The filter of claim 1, wherein at least a first selected one of the first inverter and the second inverter includes an inductor.

9. The filter of claim 1, wherein one or both of the first voltage-controlled capacitor and the second voltage-controlled capacitor is selected from the group consisting of: a varactor, a ferroelectric material, or a microelectromechanical system (MEMS) capacitor.

10. A multiplexer comprising:
at least two radio frequency (RF) bandpass filters, wherein:
the multiplexer is configured to channelize an input RF band of electromagnetic energy into a set of output channels by way of the RF bandpass filters, each output channel configured to output RF energy at a respective wavelength $\lambda_i$; and
at least one of the RF bandpass filters comprises:
a cascaded series of a first subfilter and a second subfilter, the first subfilter comprising a first input port, a first output port, a first inverter, a first voltage-controlled capacitor and a first inductor, a proximal terminal of the first inverter being coupled with the first input port, the first voltage-controlled capacitor and the first inductor being connected in parallel between a distal terminal of the first inverter and ground; the second subfilter comprising a second input port, a second output port, a second inverter, a second voltage-controlled capacitor and a second inductor, a proximal terminal of the second inverter being coupled with the second input port, the second voltage-controlled capacitor and the second inductor being connected in parallel between a distal terminal of the second inverter and the second output port, an input terminal of the second inverter being coupled with the second input port; wherein:

a first selected one of the first subfilter and the second subfilter comprises a pseudo low pass filter and a second selected one of the first subfilter and the second subfilter comprises a pseudo high pass filter; and     the RF bandpass filter is configured to output RF energy and to separately control a bandwidth and a center frequency of the RF energy, the center frequency being tunable by adjusting a voltage input to one or both of the first voltage-controlled capacitor and the second voltage-controlled capacitor.

11. The multiplexor of claim 10, wherein each of the first inductor and the second inductor have a respective self resonant frequency and one or both of the first inductor and the second inductor operate at a frequency substantially below the respective self resonant frequency.

12. The multiplexor of claim 10, wherein at least one of the RF bandpass filters is configured to control the bandwidth at a substantially fixed bandwidth W over a center frequency tuning range.

13. The multiplexor of claim 12, wherein the center frequency is tuned and the substantially fixed bandwidth W is controlled, by adjusting a respective voltage input of each of the first voltage-controlled capacitor and the second voltage-controlled capacitor.

14. The multiplexor of claim 13, wherein the center frequency tuning range is from 85% to 115% of a nominal center frequency.

15. The multiplexor of claim 14, wherein the nominal center frequency is greater than 500 MHz.

16. The multiplexor of claim 10, wherein at least a first selected one of the first inverter and the second inverter includes a capacitive inverter.

17. The multiplexor of claim 10, wherein at least a first selected one of the first inverter and the second inverter includes an inductor.

18. The multiplexor of claim 10, wherein the one or both of the first voltage-controlled capacitor and the second voltage-controlled capacitor is selected from the group consisting of: a varactor, a ferroelectric material, or a microelectromechanical system (MEMS) capacitor.

\* \* \* \* \*